US011171578B2

(12) United States Patent
Yang

(10) Patent No.: US 11,171,578 B2
(45) Date of Patent: Nov. 9, 2021

(54) POWER GENERATION DEVICE AND ELECTRIC DEVICE INCORPORATING THE SAME

(71) Applicant: City University of Hong Kong, Kowloon (HK)

(72) Inventor: Zhengbao Yang, Kowloon Tong (HK)

(73) Assignee: City University of Hong Kong, Kowloon (HK)

( * ) Notice: Subject to any disclaimer, the term of this patent is extended or adjusted under 35 U.S.C. 154(b) by 492 days.

(21) Appl. No.: 16/169,317

(22) Filed: Oct. 24, 2018

(65) Prior Publication Data

US 2020/0136530 A1 Apr. 30, 2020

(51) Int. Cl.
*H02N 2/12* (2006.01)
*H02N 2/18* (2006.01)
*H01L 41/113* (2006.01)

(52) U.S. Cl.
CPC .......... *H02N 2/123* (2013.01); *H01L 41/113* (2013.01); *H02N 2/18* (2013.01)

(58) Field of Classification Search
CPC .............. H01L 41/113; H01L 41/1132; H01L 41/1134; H01L 41/1136; H01L 41/1138; H02N 2/18; H02N 2/181; H02N 2/183; H02N 2/185; H02N 2/186; H02N 2/188
USPC ......................................................... 310/339
See application file for complete search history.

(56) References Cited

U.S. PATENT DOCUMENTS

| 7,821,183 | B2 | 10/2010 | Rastegar | |
|---|---|---|---|---|
| 8,294,336 | B2 | 10/2012 | Priya | |
| 2013/0069487 | A1* | 3/2013 | Houser | H02N 2/18 310/339 |
| 2015/0303835 | A1* | 10/2015 | Katsumura | H02N 2/188 310/329 |
| 2016/0164437 | A1* | 6/2016 | Kim | H02N 2/183 310/339 |

FOREIGN PATENT DOCUMENTS

| CN | 102255557 | 8/2013 |
|---|---|---|
| CN | 103269182 | 8/2013 |

OTHER PUBLICATIONS

Yang, Zhengbao, et al. "High-Performance Piezoelectric Energy Harvesters and Their Applications." Joule (2018).
Pozzi Michele, et al. "Low-profile and wearable energy harvester based on plucked piezoelectric cantilevers." Smart Sensors, Actuators, and MEMS VII; and Cyber-Physical Systems, vol. 9 517. International Society for Optics and Photonics, 2015.
(Continued)

*Primary Examiner* — Derek J Rosenau
(74) *Attorney, Agent, or Firm* — Renner Kenner Greive Bobak Taylor & Weber

(57) ABSTRACT

A power generation device includes a rotatable member arranged to rotate about a rotating axis in response to an application of force; and at least one power generation unit including at least one deformable member, the deformable member arranged to deform for generating electrical energy in response to the rotation of the rotatable member. The present invention also discloses a power generation device having an oscillatable member and an electric device incorporating the power generation device.

26 Claims, 6 Drawing Sheets

(56) References Cited

OTHER PUBLICATIONS

Xue, Tiancheng, et al. "Wearable inertial energy harvester with sputtered bimorph lead zirconate titanate (PZT) thin-film beams." Smart Materials and Structures (2018).
Fu, Hailing, and Eric M. Yeatman. "Comparison and Scaling Effects of Rotational Micro-Generators using Electromagnetic and Piezoelectric Transduction." Energy Technology.

* cited by examiner

POWER GENERATION DEVICE AND ELECTRIC DEVICE INCORPORATING THE SAME

FIELD OF THE INVENTION

The present invention belongs to the field of micro energy and power generation technology, and particularly relates to a power generation device based on piezoelectric effect for converting low-frequency mechanical energy into electric energy.

BACKGROUND OF THE INVENTION

Green renewable energy such as hydropower, wind energy and tidal energy is the main original source of electric energy at present and in the future. Currently, these energy sources are mainly converted into electric energy by electromagnetic generators. The flow of wind or water drives the turbine to rotate, thus causing relative movement between the coil and the magnet in the motor. This leads to the change of magnetic field in the coil and consequently the generation of induced current. However, the efficiency of such electric energy conversion is below satisfactory in low frequency range.

The present invention seeks to mitigate or at least alleviate such problems and shortcomings by providing a new or otherwise improved piezoelectric effect based power generation device.

SUMMARY OF THE INVENTION

According to the present invention, there is provided a piezoelectric effect based power generation device comprising:
 a rotatable member arranged to rotate about a rotating axis in response to an application of force; and
 at least one power generation unit comprising at least one deformable member, the deformable member arranged to deform for generating electrical energy in response to the rotation of the rotatable member.

Preferably, the rotatable member includes a receiving portion within which at least a portion of each deformable member is received.

Preferably, the receiving portion includes more than one slot about the peripheral surface of the receiving portion, each slot configured to receive at least a portion of each deformable member.

Preferably, each deformable member comprises a driven portion received in the slot of the receiving portion for deforming the deformable member in response to the rotation of the rotatable member.

Preferably, the number of the slot is not less than the number of the power generation unit.

Preferably, the slot forms a closed loop.

Preferably, the loop is arranged in a sinusoidal arrangement.

Preferably, the sinusoidal arrangement contains n sinusoidal periods, where n is an integer greater than 0.

In one example, the angular frequency of each sinusoidal period is identical to output AC with constant frequency In another example, the angular frequency of each sinusoidal period is different from output AC with variable frequency.

In one embodiment, the amplitude of the each sinusoidal period is equivalent to the amplitude of output AC with constant voltage.

In another embodiment, the amplitude of the each sinusoidal period is not equivalent to the amplitude of output AC with variable voltage.

In yet another embodiment, the loop is arranged in a non-sinusoidal arrangement.

In one example, the shape of the slots are identical.

In another example, the shape of slots are different.

Preferably, the driven portion is in a spheroid shape.

Preferably, the driven portion includes a bearing follower.

Preferably, the deformable member includes at least one piezoelectric layer

Preferably, the deformable member includes a pair of piezoelectric layers between which a flexible member is sandwiched.

Preferably, the piezoelectric layer is made from piezoelectric materials.

Preferably, the piezoelectric materials are selected from a group comprising piezoelectric ceramics, piezoelectric single crystals, and piezoelectric polymers.

Preferably, the deformable members together form a polygonal structure.

Preferably, the polygonal structure includes a trapezoidal structure.

The present invention also provides a piezoelectric effect based power generation device comprising:
 an oscillatable member arranged to oscillate about an axis in response to an application of force; and
 at least one power generation unit comprising at least one deformable member, the deformable member arranged to deform for generating electrical energy in response to the oscillation of the oscillatable member.

The present invention also relates to an electric device comprising the power generation device described above.

The power generation device according to the present invention has the advantages of: 1) high energy conversion efficiency; 2) Simple structure for easy maintenance; 3) high voltage output is possible at low rotational speed; 4) controllable amplitude, phase and frequency of the output; 5) high space utilization and energy density.

Other features and aspects of the invention will become apparent by consideration of the following description and accompanying drawings.

BRIEF DESCRIPTION OF THE DRAWINGS

The invention will now be more particularly described, by way of example only, with reference to the accompanying drawings, in which.

Figure 1:
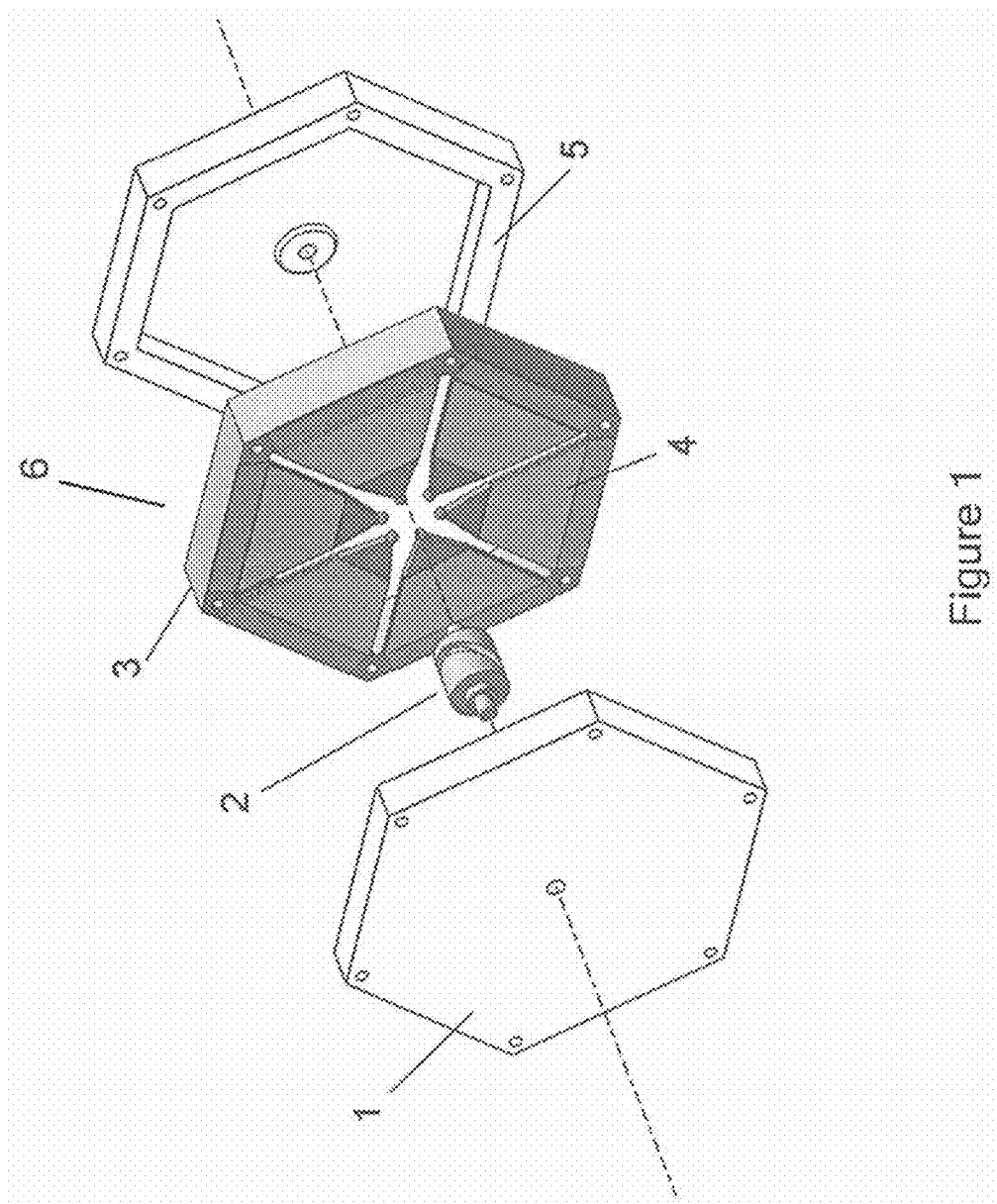
FIG. 1 is an exploded view showing the structure of the rotational piezoelectric power generation device containing a single power generation unit in an embodiment of the present invention.

Before any embodiments of the invention are explained in detail, it is to be understood that the invention is not limited in its application to the details of construction and the arrangement of components set forth in the following description or illustrated in the accompanying drawings. The invention is capable of other embodiments and of being practiced or of being carried out in various ways. Also, it is to be understood that the phraseology and the terminology used herein is for the purpose of description and should not be regarded as limiting.

DETAILED DESCRIPTION OF THE PREFERRED EMBODIMENT

Specific embodiments of the present invention will be described in detail in combination with the drawings. According to Faraday's law of electromagnetic induction, the induced electromotive force is proportional to the relative rotational speed of the coil and the magnet of the generator. Therefore, in order to achieve high efficiency of energy conversion, the rotor must have a higher rotational speed. However, in most circumstances, external driving force such as water, wind, and tide often show low frequency and unstable intensity, greatly reducing the efficiency of the electromagnetic generator. Gear case or other speed increasing mechanism is thus usually used to increase the rotational speed of the rotor. The introduction of gears further increases damping, complexity and cost of the system, and makes the system heavy and bulky.

A generator based on piezoelectric effect is able to solve above problems associated with electromagnetic generator. The piezoelectric materials can directly convert the external force caused deformation energy into electric energy with the advantages of higher energy conversion efficiency and simpler structure. In addition, the piezoelectric materials are no longer affected by electromagnetic interference which should be avoided around an electromagnetic generator. As a result, the piezoelectric based power generator does not need any speed increaser, which greatly reduces complexity and improves reliability of the system.

Piezoelectric effect based power generation device then becomes increasingly in demand. However, the existing piezoelectric effect based generators encounter many disadvantages such as high friction, irregular voltage output, low capacity and low efficiency.

Without wishing to be bound by theories, the inventors have, through their own research, trials and experiments, devised that piezoelectric effect in some smart materials such as $Pb(Zr_xTi_{1-x})O_3$ (PZT) may accumulate positive and negative charges on its surfaces in response to a deformation in a certain direction caused by an external force, and consequently an electric potential is generated.

The present invention provides a new amplitude-limited power generation device based on piezoelectric effect. In the circumstances of low and/or unstable rotational speed of external driving forces, the power generation device according to the present invention is able to stably and efficiently output alternating current.

Referring to FIGS. 1 to 6 of the drawings, there are shown major components of a power generation device 10 embodying the invention. The power generation device 10 includes a rotatable member 2 arranged to rotate about a rotating axis in response to an application of force, and a power generation unit 6 having a deformable member 4. The deformable member 4 is arranged to deform for generating electrical energy in response to the rotation of the rotatable member 2. The basic working mechanism of the present invention is to use a rotatable central cam unit to directly convert the rotational motion of the cam into a periodic bending of the deformable piezoelectric members to generate electric energy.

FIG. 1 is an exploded view showing the structure of an example rotational piezoelectric power generation device 10 containing a single power generation unit 6 in an embodiment of the present invention. The power generator includes a casing formed by two, a front cover 1 and a rear cover 5, a rotatable member 2 e.g. a central cam unit 2, a power generation unit 6 containing one or more deformable members 4 e.g. six deformable piezoelectric members 4 and a polygonal outer casing 3 for securing a portion of each deformable piezoelectric member 4. Standard components such as bearings, bolts, nuts and gaskets which are familiar to those skilled in the art are not shown in the drawings.

Preferably, the entire device is symmetrically and evenly arranged around the central axis defined by the rotatable central cam unit 2. The rotatable central cam unit 2 rotates about the central axis in response to external driving force associated with wind power, tidal power etc. The outer casing 3 is a regular hexagonal structure to secure the wide end of the deformable piezoelectric members 4, and to support substantially the entire device. The front cover 1 and the rear cover 5 are located at the front and rear sides of the device 10 for enclosing and supporting the rotatable central cam unit 2.

Figure 5A:
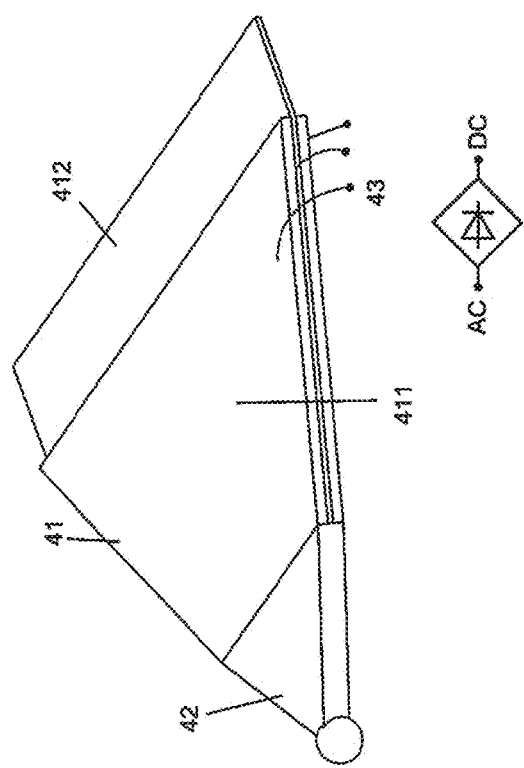
FIG. 5a shows the piezoelectric portion 41 and the driven portion 42 of the deformable piezoelectric member 4, wherein the driven portion is a sphere.
Figure 5B:
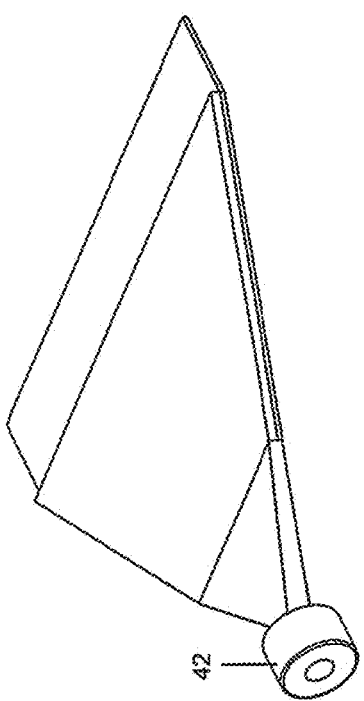
FIG. 5b shows the piezoelectric portion 41 and the driven portion 42 of the deformable piezoelectric member 4, wherein the driven portion is a bearing follower.

The deformable piezoelectric member 4 of power generation unit 6 is an essential component of the power generation device 10 in the present invention. It includes a piezoelectric portion 41 and a driven portion 42, as shown in FIGS. 5a and 5b. The piezoelectric portion 41 is preferably a trapezoidal structure with the wide end secured to the polygonal outer casing 3, and the opposite narrow end attached with the driven portion 42 in free boundary condition. The six deformable piezoelectric members 4 are secured evenly to the polygonal outer casing 3 for example by fastening means and positioned perpendicular to the central axis.

The rotatable central cam unit 2 is another essential component located in the center of the device 10. The front and rear covers 1 and 5 support the cam unit 2 through the two ends 21 of the rotatable central cam unit 2 directly or indirectly via the presence of a low friction bearing. The rotatable central cam unit 2 has a receiving portion 23 e.g. one or more slots 23 on its peripheral surface for receiving a portion of the deformable member 4 e.g. a tip portion of the driven portion 42. The slot 23 forms a closed loop about the surface of the cam unit 2 through which the driven portion 42 may be movable within the cavity defined by the slot 23.

Further referring to FIG. 1, the tip portion of the driven portion 42 moves along the amplitude defined by the slot 23 on the surface of the rotatable central cam unit 2. The power generation device 10 can be operated by rotating one of the central cam unit 2 and the outer casing 3 relative to the other. For instance, the outer casing 3 may be fixedly mounted whilst the rotatable central cam unit 2 is connected with an external rotating drive.

Alternatively, the outer casing 3 may be connected with an external rotational driving means whilst the rotatable central cam unit 2 is fixed. In this arrangement, an electric device may be mounted onto the outer casing 3 directly without any intermediate connecting members such as slip ring. This reduces the friction loss and thus enhance the efficiency of power generation.

The rotatable central cam unit 2 and the outer casing 3 are relatively rotated, and the cam slot 23 guides the tip portion of the driven portion 42 to oscillate back and forth in a reciprocating manner in a direction parallel to the central axis. Consequently, the piezoelectric portion 41 connected to the driven portion 42 is driven by the tip portion of the driven portion 42 to oscillate back and forth parallel to the central axis, and as a result an alternating current (AC) is generated.

As shown in FIG. 1, the power generation unit 6 adopts a symmetrical hexagon shape. Other shapes such as a quadrangle, a heptagon, an octagon may be also adopted according to actual requirements. The working mechanism is the same as description above and will not be reiterated.

Figures 2A, 2B, 2C:
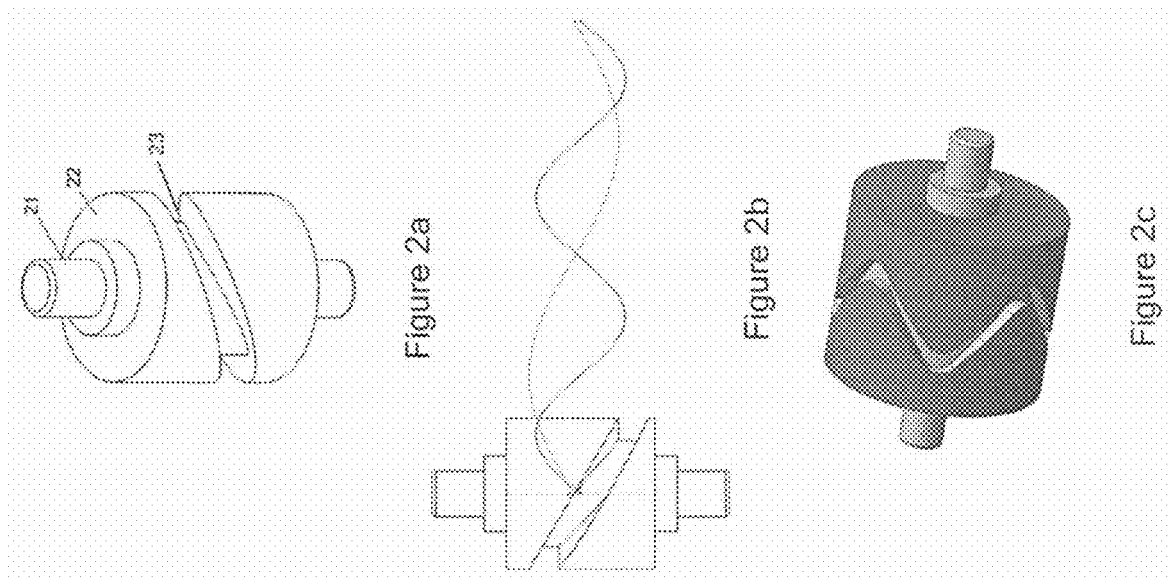
FIG. 2a shows the rotatable central cam unit 2 of FIG. 1.
FIG. 2b shows the contour line of cam slot 23 arranged on the surface of the rotatable central cam unit 2 in a sinusoidal arrangement.
FIG. 2c shows the contour line of cam slot 23 arranged on the surface of the rotatable central cam unit 2 in a non-sinusoidal arrangement.

FIG. 2a shows the structure of the rotatable central cam unit 2 of FIG. 1. It includes a cylindrical cam 22, a central cam shaft 21 extending from the two ends of the cylindrical cam 22, and a cam slot 23 on the surface of the cylindrical cam 22. The size of the cam slot 23 is slightly larger than that of the tip portion of the driven portion 42 so that the tip portion of the driven portion 42 may move smoothly when the deformable piezoelectric member 4 is bent. The cam slot 23 is extremely essential to ensure a desired power generation efficiency as it determines the trajectory of the deformable piezoelectric member 4. The open-loop voltage output is mainly affected by the height of the cam slot 23 i.e. the distance travelled by the driven portion 42 between the peak and the trough of the cam slot 23, while the rotational speed of the cylindrical cam unit 2 has little effect on it.

In FIG. 2a, the cam slot 23 is produced from a single-cycle sinusoid and forms a closed loop on the outer surface of the cylindrical cam 22, such that the oscillation of the deformable piezoelectric member 4 and the rotation of the rotatable central cam unit 2 are synchronized, i.e., the rotation of the rotatable central cam unit 2 in one cycle leads to the oscillation of the deformable piezoelectric member 4 in one up-and-down cycle. Therefore, the frequency of the output alternating current is identical to the rotational frequency of the rotatable central cam unit 2. Alternatively, the cam slot 23 may be provided by multi-cycles sinusoid such that the oscillation of the deformable piezoelectric member 4 and the rotation of the rotatable central cam unit 2 are not synchronized. Accordingly, the frequency of the output alternating current may be different from the rotational frequency of the rotatable central cam unit 2.

FIG. 2b shows the contour line of cam slot 23 arranged on the surface of the rotatable central cam unit 2 in a sinusoidal arrangement with n sinusoidal periods (where n is an integer greater than 0). When the contour line equals to two sinusoidal cycles, an output AC with doubled frequency is achieved. Analogously, an output AC with tripled or multipled frequency can also be achieved. FIG. 2c shows a non-sinusoidal cam slot that forms a closed loop on the outer surface of the cylindrical cam 22.

By adjusting the height and shape of the cam slot 23, the input torque towards the deformable piezoelectric member 4 can be controlled accurately such that a predetermined constant torque or a varying torque can be achieved according to practical requirements. For weak external driving force, the height of the cam slot 23 can be reduced to limit the degree of movement of the driven portion 42 and thus achieve effective power output. On the other hand, for powerful external driving force, the height of the cam slot 23 can be increased to allow greater degree of movement of the driven portion 42 and thus achieve higher torque and thus higher voltage output. The waveform, amplitude, frequency and phase of an output can also be controlled precisely by adjusting the profile of contour line of the cam slot 23 to match target electric circuit and load. Preferably, the amplitude of each sinusoidal period of the contour line may be adjustable for delivering different desirable AC outputs. For a constant AC output, the amplitude of each sinusoidal period is equivalent to the amplitude of the constant voltage. On the other hand, for a variable AC output, the amplitude of each sinusoidal period is not equivalent to the amplitude of the variable voltage.

It is one of the greatest advantages of the present invention that the amplitude-limited input and output can be accurately achieved. The amplitude-limited oscillation also protects the deformable piezoelectric member 4 from overloading and extends the service life of the piezoelectric material.

Figure 3:
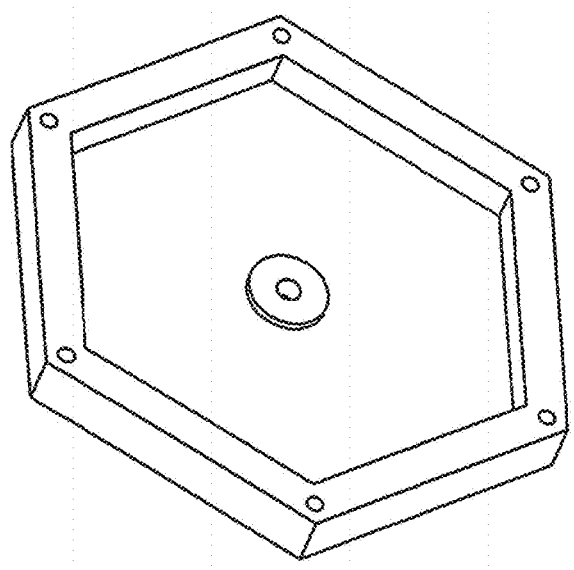
FIG. 3 shows the front and rear covers of FIG. 1.

FIG. 3 shows the front and rear covers 1, 5. The covers 1 and 5 mainly function to secure and support the central cam shaft 21. For instance, the front and rear covers 1, 5 on the main surface may include an aperture for receiving the central cam shaft 21 of the central cam unit 2. Optionally, the two covers 1, 5 are interchangeable.

Figure 4:
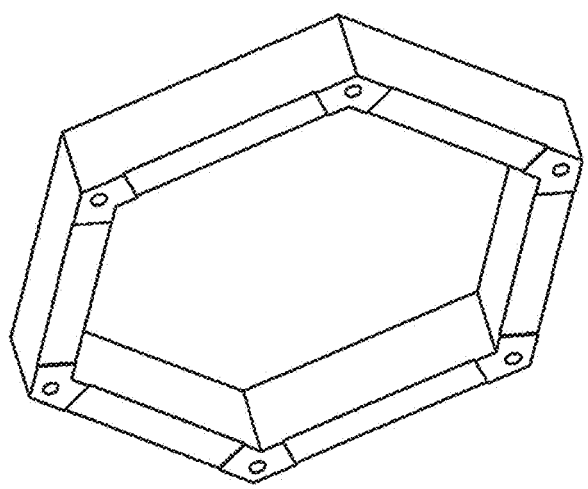
FIG. 4 shows the polygonal outer casing 3 of FIG. 1.

FIG. 4 shows the polygonal outer casing 3 of FIG. 1. The inner edge 31 of the outer casing 3 can be polygonal or circular to receive and secure the wide end of the deformable piezoelectric member 4. The outer edge 32 can be adjusted according to the processing and actual installation requirements.

FIG. 5a shows the piezoelectric portion 41 and the driven portion 42 of the deformable piezoelectric member 4. The piezoelectric portion 41 includes a pair of piezoelectric layers 411 and an elastic layer 412 sandwiched therebetween. The piezoelectric portion 41 may also be a piezoelectric monolayer. The piezoelectric portion 41 is a polygonal structure and preferably a trapezoidal structure with the wide end secured to the outer casing 3 and the narrow end connected to the driven portion 42. The inventors have devised that the trapezoidal structure helps to avoid stress concentration at the secured end and to improve stress distribution in the piezoelectric layer 411, and thereby achieving a higher energy conversion efficiency.

The tip portion of the driven portion 42 is preferably a sphere which reduces the contact friction with the cam slot 23, such that the contacting of the driven portion 42 with the cam slot 23 is smooth at different angles when the piezoelectric portion 41 is bent and deformed in various directions. The tip portion of the driven portion 42 may also include a bearing follower, as shown in FIG. 5b. In the cases where the size of the deformable piezoelectric member 4 is small and the external driving force is weak, a simple sphere is preferred because the contact friction is less significant. Alternatively, if the size of deformable piezoelectric member 4 is huge and the external driving force is powerful, the application of such bearing follower may reduce the stress therebetween and prevents the fracture of these components.

The piezoelectric layer 41 can be connected to some conducting wire 43 to output the current generated. In the embodiment, the power generation device 10 includes a plurality of deformable piezoelectric members 4 for generating multiple AC outputs. Therefore it is also important to effectively adjust and rectify the multiple AC such that the generated current will be pulsated in a uniform frequency. Advantageously, the output current is controllable and phase difference between the multiple output currents is constant.

The adjustment and rectification of the multiple output currents may be dramatically minimised.

Figure 6:
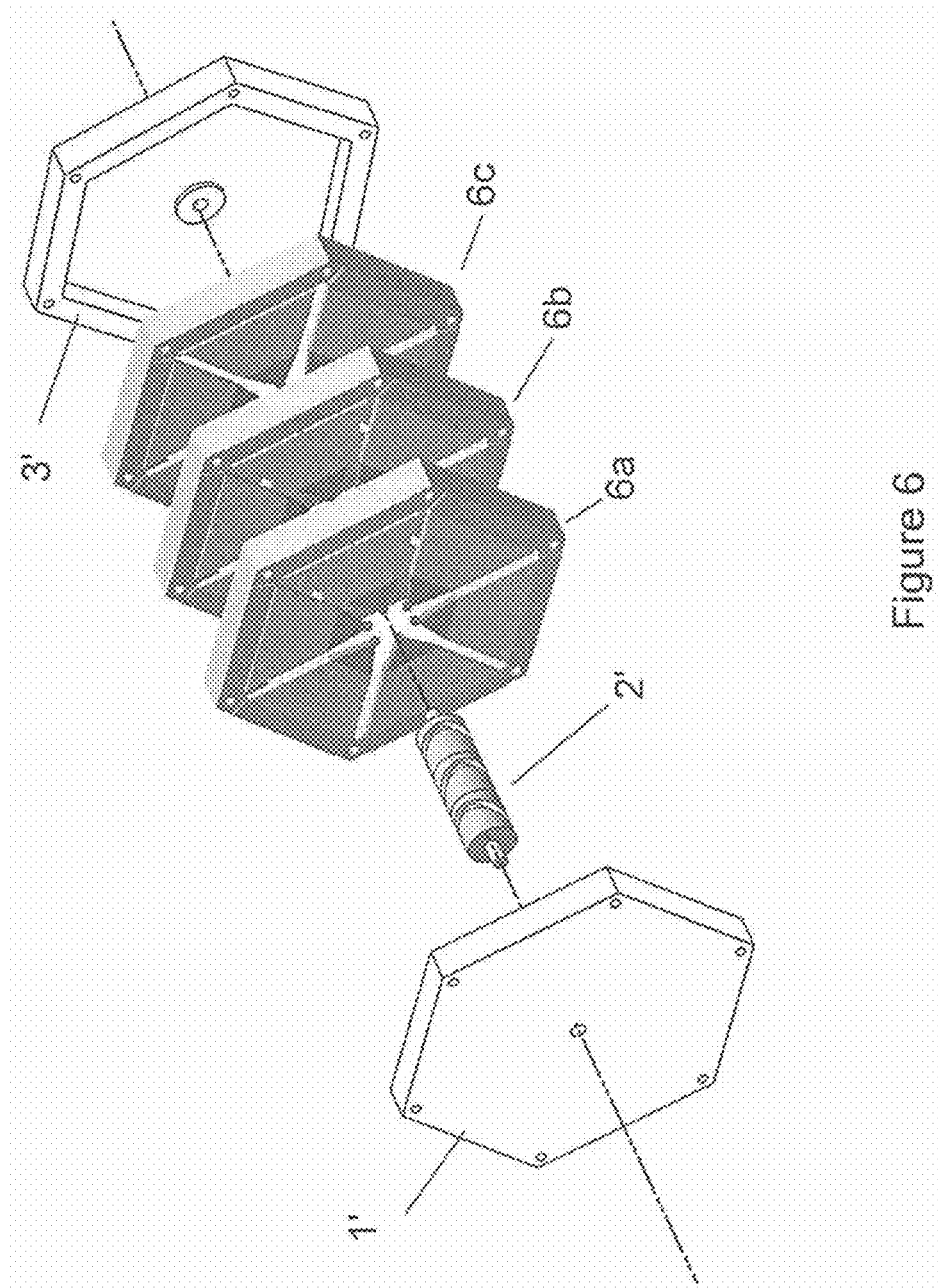
FIG. 6 is an exploded view showing the structure of the rotational piezoelectric power generation device with stacking multiple power generation units in another embodiment of the present invention.

FIG. 6 is an exploded view showing the structure of the rotational piezoelectric power generation device 20 with stacking multiple power generation units 6a, 6b, and 6c in another embodiment of the present invention. The power generation device 20 mainly includes a pair of covers 1', 3'; a rotatable central cam unit 2'; and three power generation units 6a, 6b, 6c, of which each structure can be identical or similar to that of the power generation unit 6 as discussed above. The three power generation units 6a, 6b, 6c are stacked together along the central axis defined by the cam unit 2'. More piezoelectric members 4 can be stacked together to generate higher energy output. Corresponding to the three power generation units 6a, 6b, 6c, there are three cam slots 23a, 23b and 23c each arranged on the outer surface of the cylindrical cam unit 2' respectively. The height and/or shape of the three cam slots 23a, 23b and 23c may be identical, uniform or varied from each other, depending on the phase difference of the current output required for achieving the desired AC voltage.

In addition, the three power generation units 6a, 6b, 6c may be used separately or simultaneously, depending on the capacity output in demand. For instance, the number of the slot 23 provided is larger than the number of the power generation unit 6. Depending on the required generation of AC voltage, it is only necessary to mount some of the power generation units 6 to the slots 23 whilst one or more slots 23 may be idled. For instance, only one power generation unit 6 is mounted onto one slot 23 for generating power with a relatively lower voltage and all power generation units 6 are mounted onto the respective slots 23 for generating power with a relatively higher voltage.

The piezoelectric layers 411 are preferably made of piezoelectric materials. The piezoelectric material may be a piezoelectric ceramic such as PZT, a piezoelectric single crystal such as $Pb(Mg_{1/3}Nb_{2/3})O_3$—$PbTiO_3$ (PMN-PT), a piezoelectric polymer such as polyvinylidene difluoride (PVDF) or the like.

In yet another alternative embodiment of the present invention, the rotatable central cam unit 2 may be substituted by an oscillatable member (not shown). For instance, the oscillatable member may oscillate in response to an external driving force, and as a result, trigger the movement of the deformable piezoelectric member 4 for generating electric power.

In further another embodiment of the present invention, the deformable piezoelectric member 4 is arranged transverse to the rotating axis of the rotatable central cam unit 2.

The above embodiments are merely illustrative of the preferred embodiments of the invention and are not intended to limit the scope of the invention. Any modifications and improvements of the present invention without departing from the spirit and scope of the invention should be considered as falling into the protection scope of the present patent.

The invention claimed is:

1. A power generation device comprising:
a rotatable member arranged to rotate about a rotating axis in response to an application of force; and
at least one power generation unit comprising at least one deformable member, the deformable member arranged to deform for generating electrical energy in response to the rotation of the rotatable member, wherein: the rotatable member includes a receiving portion within which at least a portion of each deformable member is received; the receiving portion includes more than one slot about the peripheral surface of the receiving portion, each slot configured to receive at least a portion of each deformable member; and each of the slots forms a closed loop.

2. The power generation device in accordance with claim 1, wherein each deformable member comprises a driven portion received in the slot of the receiving portion for deforming the deformable member in response to the rotation of the rotatable member.

3. The power generation device in accordance with claim 1, wherein the number of the slot is not less than the number of the power generation unit.

4. The power generation device in accordance with claim 1, wherein the loop is arranged in a sinusoidal arrangement.

5. The power generation device in accordance with claim 4, wherein the sinusoidal arrangement contains n sinusoidal periods, where n is an integer greater than 0.

6. The power generation device in accordance with claim 5, wherein the angular frequency of each sinusoidal period is identical to output AC with constant frequency.

7. The power generation device in accordance with claim 5, wherein the angular frequency of each sinusoidal period is different from output AC with variable frequency.

8. The power generation device in accordance with claim 5, wherein the amplitude of each sinusoidal period is equivalent to the amplitude of output AC with constant voltage.

9. The power generation device in accordance with claim 5, wherein the amplitude of each sinusoidal period is not equivalent to the amplitude of output AC with variable voltage.

10. The power generation device in accordance with claim 1, wherein the loop is arranged in a non-sinusoidal arrangement.

11. The power generation device in accordance with claim 1, wherein the shape of the slots are identical.

12. The power generation device in accordance with claim 1, wherein the shape of the slots are different.

13. The power generation device in accordance with claim 2, wherein the driven portion is in a spheroid shape.

14. The power generation device in accordance with claim 2, wherein the driven portion includes a bearing follower.

15. The power generation device in accordance with claim 1, wherein the deformable member includes at least one piezoelectric layer.

16. The power generation device in accordance with claim 15, wherein the deformable member includes a pair of piezoelectric layers between which a flexible member is sandwiched.

17. The power generation device in accordance with claim 15, wherein the piezoelectric layer is made from piezoelectric materials.

18. The power generation device in accordance with claim 17, wherein the piezoelectric materials are selected from a group comprising piezoelectric ceramics, piezoelectric single crystals, and piezoelectric polymers.

19. The power generation device in accordance with claim 1, wherein the deformable members together form a polygonal structure.

20. The power generation device in accordance with claim 19, wherein the polygonal structure includes a trapezoidal structure.

21. An electric device comprising the power generation device according to claim 1.

22. A power generation device comprising:
a rotatable member arranged to rotate about a rotating axis in response to an application of force; and a plurality of power generation unit comprising at least one deformable member, the deformable member arranged to deform for generating electrical energy in response to the rotation of the rotatable member;

wherein the rotatable member includes a receiving portion within which at least a portion of each deformable member is received;

wherein the receiving portion includes a plurality of slot about the peripheral surface of the receiving portion, each slot configured to receive at least a portion of each deformable member; and wherein the shape of the slots are different.

23. The power generation device in accordance with claim 22, wherein each deformable member comprises a driven portion received in the slot of the receiving portion for deforming the deformable member in response to the rotation of the rotatable member.

24. The power generation device in accordance with claim 22, wherein the plurality of slots include a plurality of closed loops arranged in different shapes.

25. The power generation device in accordance with claim 24, wherein the shapes of the loops define outputs of different waveforms, amplitudes, frequencies and/or phases.

26. The power generation device in accordance with claim 24, wherein each of the plurality of closed loops is arranged in a sinusoidal arrangement.

\* \* \* \* \*